United States Patent
Kim et al.

(10) Patent No.: US 8,268,194 B2
(45) Date of Patent: Sep. 18, 2012

(54) OXIDE SEMICONDUCTOR TARGET

(75) Inventors: Chang-jung Kim, Yongin-si (KR); Je-hun Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 698 days.

(21) Appl. No.: 12/071,097

(22) Filed: Feb. 15, 2008

(65) Prior Publication Data

US 2008/0206923 A1 Aug. 28, 2008

(30) Foreign Application Priority Data

Feb. 16, 2007 (KR) .................. 10-2007-0016779

(51) Int. Cl.
*H01B 1/00* (2006.01)
(52) U.S. Cl. ......... 252/500; 313/506; 428/432; 428/697
(58) Field of Classification Search .................. 252/500; 313/506; 428/432, 697
See application file for complete search history.

(56) References Cited

U.S. PATENT DOCUMENTS

| | | | |
|---|---|---|---|
| 4,960,718 A | 10/1990 | Aina | |
| 5,337,274 A | 8/1994 | Ohji | |
| 5,656,824 A | 8/1997 | Den Boer et al. | |
| 5,854,139 A | 12/1998 | Aratani et al. | |
| 5,972,527 A * | 10/1999 | Kaijou et al. | 428/697 |
| 6,107,734 A * | 8/2000 | Tanaka et al. | 313/506 |
| 6,458,636 B1 | 10/2002 | Yi et al. | |
| 6,552,387 B1 | 4/2003 | Eitan | |
| 6,562,491 B1 | 5/2003 | Jeon | |
| 6,563,174 B2 | 5/2003 | Kawasaki et al. | |
| 6,727,522 B1 | 4/2004 | Kawasaki et al. | |
| 6,727,533 B2 | 4/2004 | Matsuzaki et al. | |
| 6,878,962 B1 | 4/2005 | Kawasaki et al. | |
| 6,929,970 B2 | 8/2005 | Andriessen et al. | |
| 7,061,014 B2 | 6/2006 | Hosono et al. | |
| 7,067,843 B2 | 6/2006 | Carcia et al. | |
| 7,071,122 B2 | 7/2006 | Saenger et al. | |
| 7,145,174 B2 | 12/2006 | Chiang et al. | |
| 7,188,922 B2 | 3/2007 | Kubo | |
| 7,189,992 B2 | 3/2007 | Wager, III et al. | |
| 7,220,635 B2 | 5/2007 | Brask et al. | |
| 7,285,501 B2 | 10/2007 | Mardilovich et al. | |
| 7,411,209 B2 | 8/2008 | Endo et al. | |
| 7,456,468 B2 | 11/2008 | Jeon et al. | |

(Continued)

FOREIGN PATENT DOCUMENTS

CN 1348192 5/2002

(Continued)

OTHER PUBLICATIONS

International Search Report dated May 21, 2008.

(Continued)

*Primary Examiner* — Khanh Tuan Nguyen

(74) *Attorney, Agent, or Firm* — Harness, Dickey & Pierce, PLC

(57) ABSTRACT

A method of forming an oxide semiconductor layer includes: mounting an oxide semiconductor target in a chamber; loading a substrate into the chamber; vacuuming the chamber; applying a direct current power to the oxide semiconductor target while injecting oxygen and a sputtering gas into the chamber; and forming an oxide semiconductor layer on a surface of the substrate by applying plasma of the sputtering gas onto the oxide semiconductor target. Here, the oxide semiconductor target has a resistance of 1 k$\Omega$ or less.

4 Claims, 6 Drawing Sheets

U.S. PATENT DOCUMENTS

| | | |
|---|---|---|
| 2001/0000756 A1 | 5/2001 | Batra et al. |
| 2002/0074657 A1 | 6/2002 | Nakayama et al. |
| 2002/0146624 A1 | 10/2002 | Goto et al. |
| 2003/0218221 A1 | 11/2003 | Wager, III et al. |
| 2004/0038446 A1 | 2/2004 | Takeda et al. |
| 2004/0069990 A1 | 4/2004 | Mahajani et al. |
| 2004/0127038 A1 | 7/2004 | Carcia et al. |
| 2004/0155270 A1 | 8/2004 | Hoffman |
| 2004/0180217 A1* | 9/2004 | Inoue et al. .................. 428/432 |
| 2005/0017244 A1 | 1/2005 | Hoffman et al. |
| 2005/0039670 A1 | 2/2005 | Hosono et al. |
| 2005/0062134 A1 | 3/2005 | Ho et al. |
| 2005/0167668 A1 | 8/2005 | Korenari et al. |
| 2005/0199959 A1 | 9/2005 | Chiang et al. |
| 2005/0199960 A1 | 9/2005 | Hoffman et al. |
| 2005/0258474 A1 | 11/2005 | Tanaka et al. |
| 2005/0275038 A1 | 12/2005 | Shih et al. |
| 2006/0003485 A1 | 1/2006 | Hoffman et al. |
| 2006/0038242 A1 | 2/2006 | Hsu et al. |
| 2006/0068091 A1 | 3/2006 | Denda |
| 2006/0079034 A1 | 4/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0214008 A1 | 9/2006 | Asami et al. |
| 2006/0220023 A1 | 10/2006 | Hoffman et al. |
| 2006/0244107 A1 | 11/2006 | Sugihara et al. |
| 2006/0284172 A1 | 12/2006 | Ishii |
| 2006/0286737 A1 | 12/2006 | Levy et al. |
| 2006/0292777 A1 | 12/2006 | Dunbar |
| 2007/0007538 A1 | 1/2007 | Ono et al. |
| 2007/0023750 A1 | 2/2007 | Chiang et al. |
| 2007/0072439 A1 | 3/2007 | Akimoto et al. |
| 2007/0184576 A1 | 8/2007 | Chang et al. |
| 2007/0187760 A1 | 8/2007 | Furuta et al. |
| 2007/0194379 A1 | 8/2007 | Hosono et al. |
| 2007/0254399 A1 | 11/2007 | Wang |
| 2008/0067508 A1 | 3/2008 | Endo et al. |
| 2008/0197414 A1 | 8/2008 | Hoffman et al. |
| 2008/0206923 A1 | 8/2008 | Kim et al. |
| 2008/0315194 A1 | 12/2008 | Kim et al. |
| 2008/0315200 A1 | 12/2008 | Kim et al. |
| 2009/0211903 A1 | 8/2009 | Lee et al. |
| 2010/0127253 A1 | 5/2010 | Inoue et al. |

FOREIGN PATENT DOCUMENTS

| | | |
|---|---|---|
| EP | 1 737 044 | 12/2006 |
| JP | 63-265818 * | 11/1988 |
| JP | 10-306367 * | 11/1998 |
| JP | 2003-017749 | 1/2003 |
| JP | 2004-356196 | 12/2004 |
| JP | 2005-026465 | 1/2005 |
| JP | 2006-005116 | 1/2006 |
| JP | 2007-073312 * | 3/2007 |
| JP | 2007-529119 | 10/2007 |
| KR | 10-2000-0074893 | 12/2000 |
| KR | 10-2005-0092712 | 9/2005 |
| KR | 10-2006-0114469 | 11/2006 |
| KR | 10-2007-0090182 | 9/2007 |
| KR | 10-0811997 | 3/2008 |
| WO | WO 2005/074038 A1 | 8/2005 |
| WO | WO 2005/088726 | 9/2005 |
| WO | WO 2007/040194 | 6/2008 |

OTHER PUBLICATIONS

European Search Report and Written Opinion dated Jun. 16, 2010.
European Search Report and Written Opinion dated Jun. 14, 2010.
Office Action mailed May 11, 2010 for co-pending U.S. Appl. No. 11/978,581.
Office Action mailed Sep. 12, 2008 for co-pending U.S. Appl. No. 11/898,037.
Office Action mailed Jun. 25, 2009 for co-pending U.S. Appl. No. 11/898,037.
Office Action mailed Mar. 6, 2009 for co-pending U.S. Appl. No. 11/898,037.
Office Action mailed Aug. 20, 2009 for co-pending U.S. Appl. No. 11/785,269.
Office Action mailed Apr. 2, 2010 for co-pending U.S. Appl. No. 12/213,327.
Office Action mailed Sep. 15, 2009 for co-pending U.S. Appl. No. 12/213,327.
Office Action mailed Nov. 16, 2009 for co-pending U.S. Appl. No. 12/213,399.
Office Action mailed May 21, 2010 for co-pending U.S. Appl. No. 11/785,269.
International Search Report dated Dec. 19, 2008.
International Search Report dated Sep. 25, 2008.
European Search Report dated Aug. 28, 2009.
Chinese Office Action mailed Aug. 4, 2010 and English translation thereof.
Chinese Office Action mailed Aug. 23, 2010 and English translation thereof.
Notice of Allowance dated Oct. 14, 2010, issued in co-pending U.S. Appl. No. 11/785,269.
Office Action for Chinese Application No. 200780022377.5 dated Oct. 25, 2010 and English Translation thereof.
Office Action for U.S. Appl. No. 11/978,581.
Supplemental Notice of Allowance dated Dec. 27, 2010 in co-pending U.S. Appl. No. 11/785,269.
Office Action dated Jan. 13, 2011 in co-pending U.S. Appl. No. 12/453,530.
U.S. Office Action dated Jul. 7, 2011, issued in co-pending U.S. Appl. No. 12/453,530.
The MOSFET- Introduction, MOS Field Effect Transistors, Van Zeghbroeck, Web book "Principles of Semiconductor Devices", Boulder, Dec. 2004, Chapter 7.
U.S. Office Action dated Jul. 25, 2011, issued in co-pending U.S. Appl. No. 12/213,402.
Office Action issued by the European Patent Office dated May 10, 2011 for EP Application No. 09 160 223.5-1528.
U.S. Office Action dated Oct. 6, 2011, issued in co-pending U.S. Appl. No. 11/978,581.
Japanese Office Action dated Jan. 1, 2012 issued in Japanese Application No. 2009-506414.
Carcia, P.F. et al. "Transparent ZnO thin-film transistor fabricated by rf magnetron sputtering," Applied Physics Letters, vol. 82, No. 7 (Feb. 17, 2003): pp. 1117-1119.
U.S. Notice of Allowance dated Dec. 8, 2011 issued in U.S. Appl. No. 12/213,402.
European Search Report dated Jan. 23, 2012 issued in European Application No. 11183826.4.
European Exam Report dated Jan. 23, 2012 issued in European Application No. 09160223.5.
U.S. Office Action dated Mar. 22, 2012 issued in U.S. Appl. No. 12/929,324.
U.S. Notice of Allowance dated Apr. 5, 2012 issued in U.S. Appl. No. 12/213,402.
U.S. Office Action dated Apr. 6, 2012 issued in U.S. Appl. No. 11/978,581.
U.S. Office Action dated Apr. 13, 2012 issued in U.S. Appl. No. 12/929,323.

* cited by examiner

OXIDE SEMICONDUCTOR TARGET

PRIORITY STATEMENT

This application claims the benefit of Korean Patent Application No. 10-2007-0016779, filed on Feb. 16, 2007, in the Korean Intellectual Property Office, the disclosure of which is incorporated herein in its entirety by reference.

BACKGROUND

1. Field

Example embodiments relate to a target material and a method of manufacturing a semiconductor device using the same, and more particularly, to an oxide semiconductor target and a method of forming the same, a method of forming an oxide semiconductor layer using the same and a method of manufacturing a semiconductor device using the same.

2. Description of Related Art

Oxides including Zn or In, for example, ZnO, InGaZnO4, Zn—In—O, or Zn—Sn—O, may have a mobility of 10 to 100 times greater than amorphous silicon.

Also, the oxides may show good semiconductor characteristics, that is, they may have an on/off current ratio ($I_{on}/I_{off}$ ratio) of $10^5$ to $10^7$. Also, since the oxides have a large band gap of 3.2 to 3.4 eV, they may have small leakage current due to visible light.

Hereinafter, oxides that include Zn, In, Ga, Sn, or a composite of these materials will be referred to as oxide semiconductors.

An oxide semiconductor layer formed of the oxide semiconductor may be formed using an RF sputtering method, a pulsed laser deposition method, a molecular-beam epitaxy method, or a metal organic chemical vapor deposition method.

However, when the above methods are applied to LCD panels that use large glass substrates, the productivity of the LCD panels may be reduced due to very slow deposition rate of the oxide semiconductor layer and the difficulty of ensuring uniformity of the oxide semiconductor layer.

Currently in the LCD industry, oxide semiconductor layers, for example, ZnO layers, $In_2O_3$ layers, $Ga_2O_3$ layers, Hf—In—Zn—O layers, Zn—In—O layers, Zn—Sn—O layers, or Ga—In—Zn—O layers are mainly deposited using an RF magnetron sputter method.

However, when the oxide semiconductor layers are formed using the RF magnetron sputter method, the deposition rate of the oxide semiconductor layers may be lower than that of an amorphous silicon film.

The oxide semiconductor layers may be formed using an oxygen reactive DC sputter method in which a pure metal alloy that includes at least one of In, Ga, Zn, and Sn may be used as a target and oxygen gas may be supplied during the deposition.

However, in this method, the pure metal alloy used as a target may be brittle, and it is difficult to control the composition of the oxide semiconductor layer since the composition change at the surface of the oxide semiconductor layer may be severe due to the addition of oxygen. Accordingly, it may be difficult to apply the oxygen reactive DC sputter method to deposit the oxide semiconductor layer on a large glass substrate.

SUMMARY

To solve the above and/or other problems, example embodiments may provide an oxide semiconductor target which is used as a sputtering target.

Example embodiments may also provide a method of forming the oxide semiconductor target having a resistance of 1 kΩ or less.

Example embodiments may also provide a method of forming an oxide semiconductor layer using the oxide semiconductor target, which increases the deposition rate of the oxide semiconductor layer.

Example embodiments may also provide a method of forming a semiconductor device using the method of forming the oxide semiconductor layer.

Example embodiments may provide an oxide semiconductor target having a resistance, wherein the resistance may be 1 kΩ or less.

Example embodiments may provide a method of forming an oxide semiconductor target having a resistance of 1 kΩ or less, the method comprising: mixing and forming raw materials of the oxide semiconductor target; and sintering the formed product at a predetermined temperature in an atmosphere including at least one of oxygen and nitrogen.

The mixing and forming of the raw materials of the oxide semiconductor target may comprise: mixing the raw materials of the oxide semiconductor target; drying and granulating the mixed product; and pouring and forming the granulated product in a container.

After the sintering of the formed product, the method may further comprise processing the sintered product. In the processing of the sintered product, the sintered product may be processed so that the sintered product has a smooth surface.

After the mixing of the raw materials of the oxide semiconductor target and before the drying and granulating of the mixed product, the method may further comprise grinding the mixed product.

After the processing of the sintered product, the method further comprising bonding the processed sintered product to a supporter. The supporter may be a metal pad.

At least two selected from first through third oxides may be used as the raw materials.

At least one example embodiment provides a method of forming an oxide semiconductor layer which may include: loading a substrate in a chamber in which an oxide semiconductor target is mounted; vacuuming the chamber; applying a direct current power to the oxide semiconductor target while injecting oxygen and a sputtering gas into the chamber; and forming an oxide semiconductor layer on a surface of the substrate by applying plasma of the sputtering gas onto the oxide semiconductor target.

The oxide semiconductor target may have a resistance of 1 kΩ or less.

Oxygen may be supplied to the chamber to maintain the oxygen content b in the chamber so that b may be between 0% and 40% by volume.

The sputtering gas may be supplied to the chamber to maintain the sputtering gas content a in the chamber so that a may be between 60% and 100% by volume.

The sputtering gas may be one selected from the group consisting of Ar, Xe, Ne, Kr, and a mixture of these gases.

The direct current power applied to the oxide semiconductor target may be 2 to 100 W/cm$^2$.

The oxide semiconductor target may have a composition of x(first oxide).y(second oxide).z(third oxide), wherein x, y, z are molar ratios.

The first through third oxides respectively may be $Ga_2O_3$, $In_2O_3$, and ZnO, where x+y+z=1, x or y≧0.15, and z≧0.15.

The first through third oxides respectively may be $Ga_2O_3$, $In_2O_3$, and ZnO, where x, y, and z meet one of the following three sets of conditions: x+y=1, 0.15≦x≦0.85 and z=0; y+z=1, 0.15≦y≦0.85 and x=0; or x+z=1, 0.15≦z≦0.85 and y=0.

A molar ratio of $Ga_2O_3:In_2O_3:ZnO$ may be 1:1:1, 0.5:0.5: 1, or 2:2:1.

The chamber may be a DC sputter chamber that is operated using one of a single magnetic cathode method, a multi-magnetic cathode method, and a multi-cathode method.

The substrate may be a flexible substrate.

The oxide semiconductor target may be amorphous.

When the chamber is operated using the multi-magnetic cathode method, both an RF power and a DC power may be applied to the oxide semiconductor target.

In the oxide semiconductor target and the methods of forming the oxide semiconductor target and the oxide semiconductor layer, the first through third oxides respectively may be $HfO_2$, $In_2O_3$, and ZnO, where 0<x<1, y≧0.15, and z≧0.15. Also, the first through third oxides respectively may be $HfO_2$, $In_2O_3$, and ZnO, where x, y, and z meet one of the following three sets of conditions: x+y=1, 0.15≦x≦0.85, z=0; y+z=1, 0.15≦y≦0.85, x=0; and 0.15≦z, y=0. Also, a molar ratio of $HfO_2:In_2O_3:ZnO$ may be 0.1:1:2, 0.2:1:2, 0.3:1:2 or 0.4:1:2. Also, each of the first through third oxides may be any one of $Ga_2O_3$, $HfO_2$, $In_2O_3$, ZnO, and SnO, but different from each other. Also, the first oxide may be one of $Ga_2O_3$, $HfO_2$, $In_2O_3$, ZnO, and SnO, and x=1, y and z=0.

At least one example embodiment provides a method of manufacturing a semiconductor device that may include providing a gate electrode, providing a channel layer, providing a source electrode, and providing a drain electrode, wherein the channel layer may be an oxide semiconductor layer, and may be formed using the method of forming an oxide semiconductor layer described above.

The composition of the oxide semiconductor target, a molar ratio, and the relationship between x, y, and z may be the same as described in the method of forming an oxide semiconductor layer.

The gate electrode may be formed on or under the channel layer.

The semiconductor device may be annealed.

The channel layer may be formed at a temperature ranging from room temperature to 200° C. or above.

The gate electrode may be formed on the SOI substrate and the gate electrode may have a specific resistance of 300 μΩcm or less.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
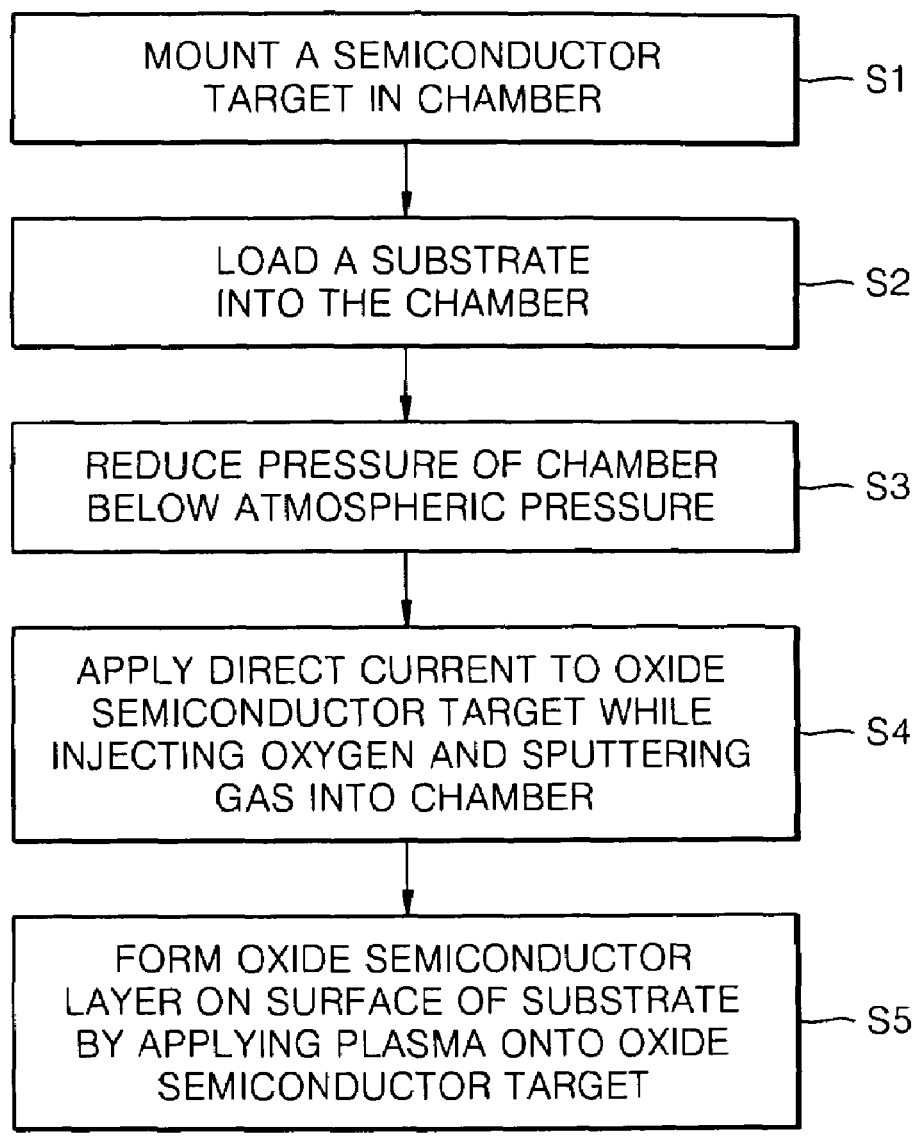
FIG. 1 is a block diagram illustrating a method of forming an oxide semiconductor layer according to at least one example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments will now be described more fully with reference to the accompanying drawings. In the drawings, the thicknesses of layers and regions may be exaggerated for clarity.

A method of forming an oxide semiconductor layer according to at least one example embodiment is described below with reference to FIG. 1. Also, the at least example embodiment for the method of forming the oxide semiconductor layer comprises an example embodiment for an oxide semiconductor target which may be used as a sputtering target.

FIG. 1 is a block diagram illustrating a method of forming an oxide semiconductor layer according to at least one example embodiment.

Referring to FIG. 1, a substrate may be loaded in a chamber on which an oxide semiconductor target is mounted (S1). The substrate may be, for example, a glass or silicon wafer. The substrate may be a flexible substrate formed of a flexible material. The substrate may include a predetermined or desired structure thereon.

The chamber may be, for example, a DC magnetron sputter chamber (hereinafter, a DC sputter chamber).

A DC sputter chamber may be operated using one of a single magnetic cathode method, a multi-magnetic cathode method, and a multi-cathode method.

However, the oxide semiconductor layer may have to be deposited to a uniform thickness on a wide area. Using the multi-magnetic cathode method may be useful for depositing on a wide area. When the chamber is operated using the multi-magnetic cathode method, a DC power as well as an RF power may be applied.

The resistance of the oxide semiconductor target may be equal to or less than 1 k$\Omega$ so that DC sputtering is possible. The oxide semiconductor target may be amorphous. The oxide semiconductor target may have a composition of x(first oxide).y(second oxide).z(third oxide) where x, y and z are molar ratios. The first through third oxides may each be oxide semiconductors. The first through third oxides may each be selected from $Ga_2O_3$, $HfO_2$, $In_2O_3$, ZnO, and SnO and may be different from each other. For example, the first through third oxides may be $Ga_2O_3$, $In_2O_3$, and ZnO respectively and the following conditions may be met: x+y+z=1, x or y$\geq$0.15 and z$\geq$0.15. A molar ratio of $Ga_2O_3$:$In_2O_3$:ZnO may be 1:1:1, 0.5:0.5:1, or 2:2:1.

Also, x, y, and z may meet one of the three following sets of conditions:

x+y=1, 0.15$\leq$x$\leq$0.85, z=0;
y+z=1, 0.15$\leq$y$\leq$0.85, x=0; or
x+z=1, 0.15$\leq$z$\leq$0.85, y=0

When the first through third oxides meet one of the above conditions, the oxide semiconductor target may be a binary target. For example, the target may be a binary oxide semiconductor target that includes (Zn, In), (Ga, In), (Ga, Zn), or (Zn, Sn). The oxide semiconductor layer formed on the substrate may be a Zn—In—O layer or a Zn—Sn—O layer.

The oxide semiconductor target may be a single target which is formed of one of $Ga_2O_3$, $HfO_2$, $In_2O_3$, and ZnO, and x=1, y and z=0. The oxide semiconductor layer formed on the substrate may be one of $Ga_2O_3$, $HfO_2$, $In_2O_3$, and ZnO.

The oxide semiconductor target may be formed by sintering an oxide semiconductor under a reduction atmosphere. The sintering may be performed in a furnace. In the sintering, the oxide semiconductor target may be made to have semiconductor characteristics, for example, x, y, and z may meet the above-described conditions and the resistance may be 1 k$\Omega$ or less, by controlling the oxygen content in the reduction atmosphere. The oxygen content in the reduction atmosphere may be less than 21% which is the oxygen content in the air at atmospheric pressure.

The pressure of the chamber in which the substrate is loaded may be reduced to a pressure suitable for depositing an oxide semiconductor layer (S2).

The pressure of the chamber may be lower than atmospheric pressure and close to vacuum.

A DC power may be applied to the oxide semiconductor target while injecting oxygen and a sputtering gas into the chamber whose pressure may be controlled to be lower than atmospheric pressure (S3).

Oxygen may be supplied to the chamber so that the oxygen content b may be between 0% and 40% by volume. The sputtering gas may be supplied to the chamber so that the sputtering gas content a may be between 60% and 100% by volume. Also, the sputtering gas may be one selected from the group consisting of Ar, Xe, Ne, Kr, and a mixture of these gases. The DC power applied to the oxide semiconductor target may be 2 to 100 W/cm$^2$.

An oxide semiconductor layer may be formed on the surface of the substrate by applying plasma to the oxide semiconductor target (S4).

For example, plasma of the sputtering gas may be generated by the DC power applied to the oxide semiconductor target. When the plasma is generated, sputtering ions, for example, Ar ions included in the plasma may collide with the oxide semiconductor target. As a result, a source material that constitutes the oxide semiconductor layer may be emitted towards the substrate from the oxide semiconductor target. The emitted source material may be deposited on the substrate. At this point, the deposition temperature of the substrate may be room temperature or higher. The deposition temperature may vary according to the material of the substrate. For example, if the substrate is a flexible substrate, the deposition may be performed in a temperature range from room temperature to 200° C. If the substrate is a glass substrate or a semiconductor substrate (for example, a silicon substrate), the deposition may be performed at a temperature higher than 200° C.

As described above, the use of the method of forming an oxide semiconductor layer according to at least one example embodiment may increase the deposition rate for depositing an oxide semiconductor layer when compared to a conventional RF sputtering method. This may be seen from the graph of FIG. 2.

Figure 2:
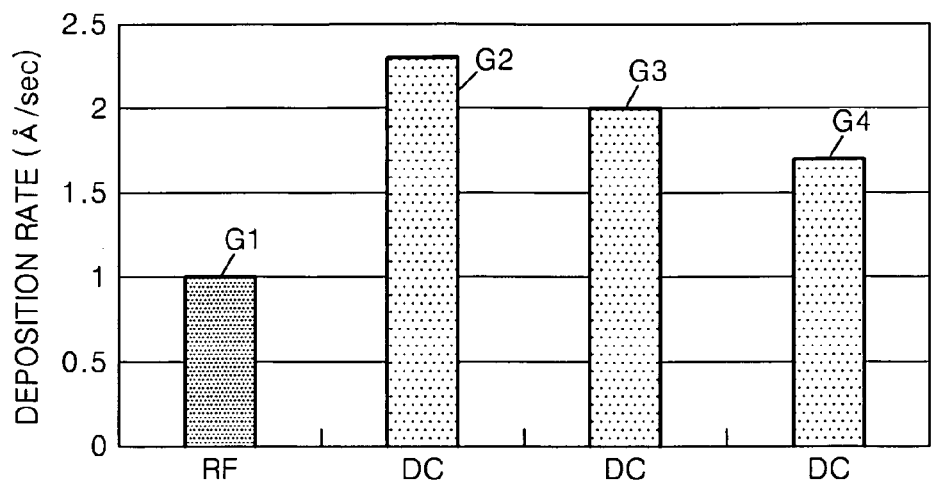
FIG. 2 is a bar graph showing the deposition rate of an oxide semiconductor layer using the method of forming the oxide semiconductor layer of FIG. 1 and a conventional RF sputtering method.

FIG. 2 is a bar graph showing the deposition rates of a Ga2O3—In2O3—ZnO (GIZO) film (hereinafter, a first GIZO film) formed according to the method of forming an oxide semiconductor layer according to at least one example embodiment and a GIZO film (hereinafter, a second GIZO film) formed using a conventional RF sputtering method. The first and second GIZO films were formed using Ar gas as a sputtering gas at a constant flow rate of 95 sccm. An RF power and a DC power both were maintained at 200 W. When the second GIZO film was formed, oxygen was supplied at a flow rate of 5 sccm.

Three first GIZO films were formed according to the oxygen flow rate.

A first GIZO film was formed using an oxygen flow rate of 2.5 sccm, a second first GIZO film was formed using an oxygen flow rate of 5 sccm, and a third first GIZO film was formed using an oxygen flow rate of 7.5 sccm.

In FIG. 2, the first bar G1 indicates the deposition rate of the second GIZO film. The second through fourth bars G2 through G4 respectively indicate the deposition rates of the first though third first GIZO films.

When the first through fourth bars G1 through G4 in FIG. 2 are compared, the deposition rate of the second GIZO film is 1 Å/sec; however, the three first GIZO films have a deposition rate of 1.7 Å/sec or above. In particular, in the case of the first GIZO film, the deposition rate is 2.33 Å/sec which may be more than twice than that of the conventional second GIZO film.

An experiment for observing a relationship between the DC power and the deposition rate with respect to the first GIZO film was performed.

In this experiment, two first GIZO films were manufactured. One of the two first GIZO films was formed by applying a DC power of 200 W, and the other was formed by applying a DC power of 300 W. In this experiment, the oxygen supply rate was maintained at 2.5 sccm, and the rest of the deposition conditions were maintained at the same conditions as the above experiment.

Figure 3:
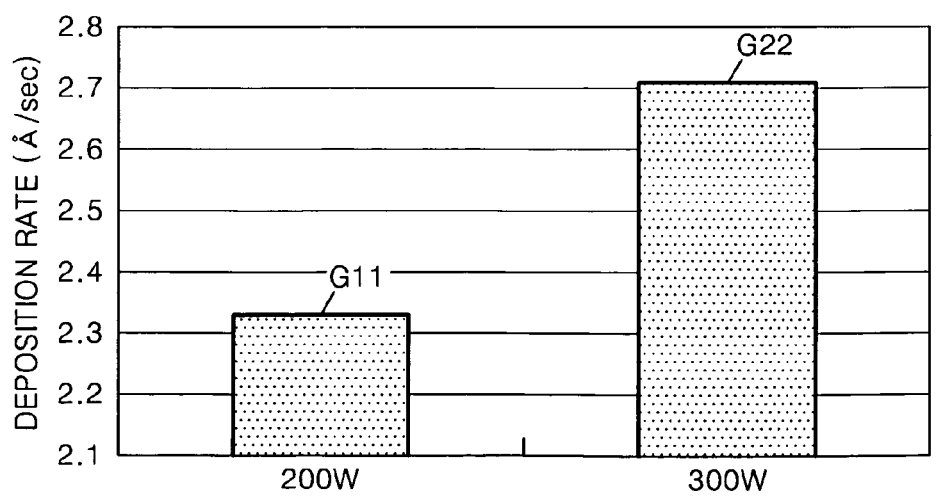
FIG. 3 is a bar graph showing the deposition rate of an oxide semiconductor layer when DC powers of 200 W and 300 W are used in the method of forming the oxide semiconductor layer of FIG. 1.

FIG. 3 is a bar graph showing the result of the experiment. In FIG. 3, a first bar G11 indicates the deposition rate of the first GIZO film formed by applying a DC power of 200 W, and a second bar G22 indicates the deposition rate of the first GIZO film formed by applying a DC power of 300 W.

When the first and second bars G11 and G22 in FIG. 3 are compared, the deposition rate of the first GIZO film increases as the DC power increases when the rest of the conditions are identical.

Figure 4:
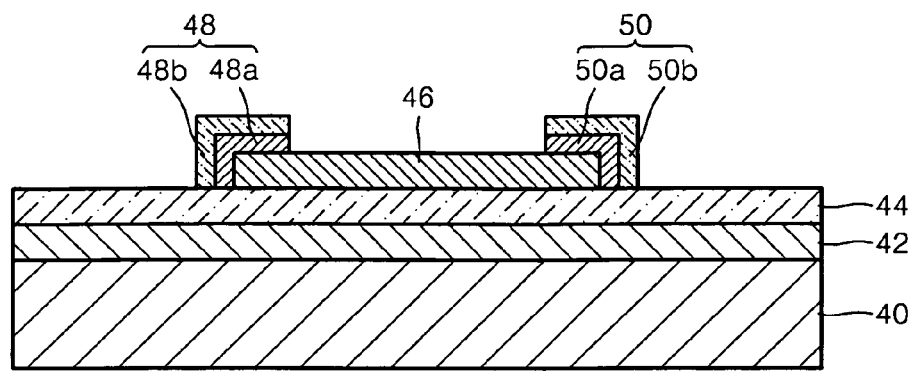
FIG. 4 is a cross-sectional view for illustrating a method of manufacturing a semiconductor device using the method of forming the oxide semiconductor layer of FIG. 1, according to at least one example embodiment.

Example embodiment of a method of manufacturing a semiconductor device using the method of forming an oxide semiconductor layer described above will now be described. FIG. 4 is a cross-sectional view for illustrating a method of manufacturing a semiconductor device using the method of forming the oxide semiconductor layer of FIG. 1, according to at least one example embodiment.

Referring to FIG. 4, a gate electrode 42 and a gate insulating layer 44 may be sequentially formed on a substrate 40. The substrate 40 may be a glass substrate or a silicon substrate, or may be a flexible substrate. The gate electrode 42 may be a silicon electrode doped with an n type impurity. The gate insulating layer 44 may be a silicon oxide layer. According to the current example, the gate insulating layer 44 may be formed to a thickness of approximately 1000 Å. A channel layer 46 may be formed on the gate insulating layer 44. The channel layer 46 may be an oxide semiconductor layer, for example, a GIZO layer, a Hf—In—Zn—O, a Zn—Sn—O layer, a Zn—In—O layer, a $Ga_2O_3$ layer, an $In_2O_3$ layer, or a ZnO layer. The channel layer 44 may be formed using the fabricating method of the oxide semiconductor layer in FIG. 1. If the channel layer 46 is formed of GIZO, the channel layer 46 may be formed to a thickness of 700 Å. First and second electrode layers 48 and 50 may be formed on the gate insulating layer 44 and may be separated from and facing each other. The first and second electrode layers 48 and 50 may be formed simultaneously. The first electrode layer 48 may be formed to contact an end of the channel layer 46, and the second electrode layer 50 may be formed to contact the other end of the channel layer 46. The first and second electrode layers 48 and 50 may contact portions of side surfaces and portions of an upper surface of the channel layer 46. One of the first and second electrode layers 48 and 50 may be a source electrode and the other one may be a drain electrode. After sequentially stacking first and second metal layers 48a and 48b, the first electrode layer 48 may be formed by patterning the first and second metal layers 48a and 48b. The second electrode layer 50 may be formed by sequentially stacking third and fourth metal layers 50a and 50b and patterning the third and fourth metal layers 50a and 50b. The third and fourth metal layers 50a and 50b may be identical to the first and second metal layers 48a and 48b. Therefore, the first and second metal layers 48a and 48b, that may cover the channel layer 46, may be formed on the gate insulating layer 44 and the first and second electrode layers 48 and 50 may be formed by sequentially removing portions of the first and second metal layers 48b and 48a to expose the upper surface of the channel layer 46. According to at least one example embodiment, the portions of the first and second metal layers 48a and 48b may be removed using a lift off method or a photolithography etching method. The first metal layer 48a may be a Ti layer, and the second metal layer 48b may be a Pt layer or a Mo layer. The first metal layer 48a may be formed to a thickness of approximately 100 Å, and the second metal layer 48b may be formed to a thickness of approximately 1000 Å.

Other processes performed in addition to the forming of the first and second electrode layers 48 and 50 may be typical processes in the related art.

A semiconductor device, for example, a thin film transistor, manufactured as described above may be annealed for a predetermined or desired time.

Figure 5:
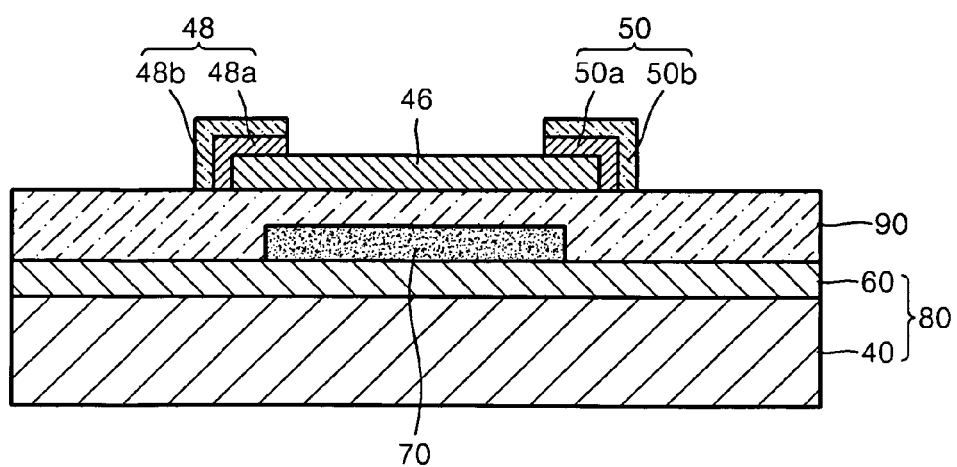
FIG. 5 is a cross-sectional view of a semiconductor device manufactured using the method of manufacturing a semiconductor device described with reference to FIG. 4, including a gate electrode formed on a SOI substrate, according to at least one example embodiment.

FIG. 5 is a cross-sectional view of a semiconductor device manufactured using the method of manufacturing a semiconductor device described with reference to FIG. 4, including a gate electrode 70 formed on a SOI substrate 80, according to at least one example embodiment. As depicted in FIG. 5, the gate electrode 70 may be formed on a buffer layer 60 that may cover an upper surface of a substrate 40, and a gate insulating layer 90 that may cover the gate electrode 70 may be formed on the buffer layer 60. The substrate 40 and the buffer layer 60 constitute the SOI substrate 80. The buffer layer 60 may be a silicon oxide layer. The gate electrode 70 may be formed of a material having a specific resistance of 300 µΩcm or less, for example, a Mo electrode. The gate insulating layer 90 may be a silicon nitride layer. Other processes performed in addition to the forming of the gate insulating layer 90 may be the same processes as described with reference to FIG. 4.

Referring to FIGS. 4 and 5, the semiconductor devices may be bottom gate type thin film transistors in which the gate electrodes 42 and 70 are located below the channel 46. However, the method of manufacturing a semiconductor device according to at least one example embodiment may be applied to a top gate type thin film transistor in which the gate electrodes 42 and 70 are located above the channel layer 46. In the method of manufacturing a top gate type thin film transistor, the channel layer 46 may also be formed using the method of forming an oxide semiconductor layer illustrated in FIG. 1.

Results of an experiment conducted to observe current-voltage characteristics of a thin film transistor manufactured according to example embodiments of the method of manufacturing a semiconductor device as described above will now be described.

In the present experiment, first through fourth thin film transistors (TFTs) were used. A channel layer of the first through fourth TFTs was a GIZO ($Ga_2O_3$—$In_2O_3$—ZnO) layer.

The first and second TFTs were manufactured using the method of manufacturing a semiconductor device according to example embodiments as described above. However, when the channel layer was formed, Ar gas was used as a sputtering gas and the flow rate was maintained at 190 sccm. An oxygen supply rate was maintained at 2.5 sccm. After the first TFT was manufactured, the first TFT was annealed at a temperature of 300° C. for one hour, and after the second TFT was manufactured, the second TFT was annealed at a temperature of 350° C. for one hour.

The third and fourth TFTs were manufactured to be identical to the first and second TFTs. However, the channel layer of the third and fourth TFTs was formed using a conventional RF magnetron sputtering method. The third and fourth TFTs respectively were annealed in the same manner as the first and second TFTs.

In order to measure the current-voltage characteristics of the first through fourth TFTs, a source-drain current Ids of each of the first through fourth TFTs was measured by changing a gate voltage Vg with respect to three drain voltages Vd different from each other.

Figure 6:
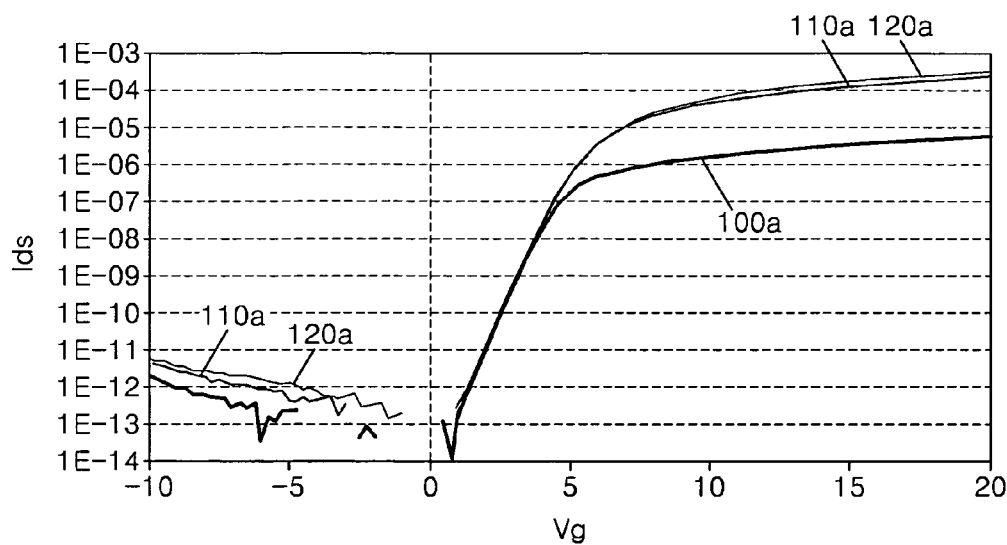
FIGS. 6 and 8 are graphs showing current-voltage characteristics of a thin film transistor annealed at temperatures of 300 and 350° C. respectively after the thin film transistor is formed using a method of forming an oxide semiconductor layer according to at least one example embodiment.
Figure 7:
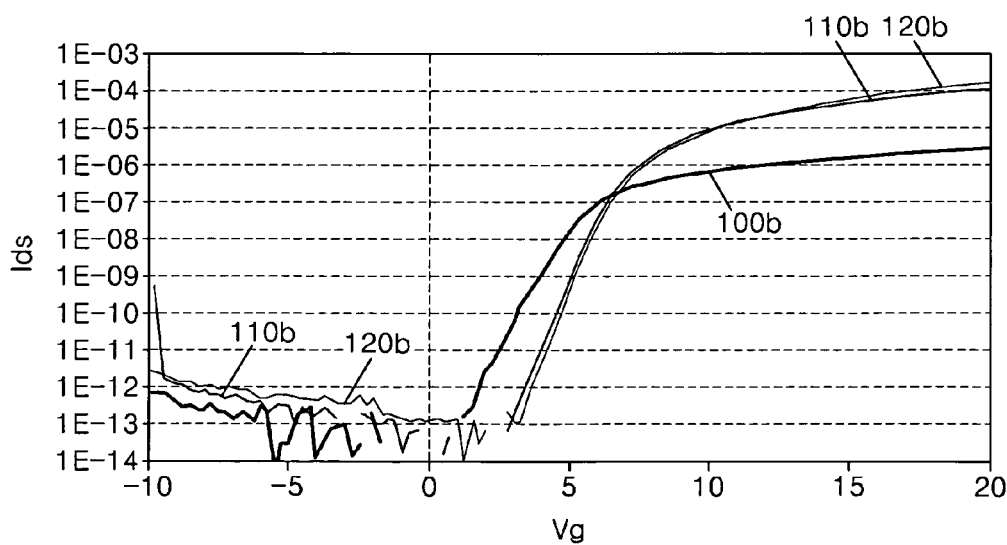
FIGS. 7 and 9 are graphs showing current-voltage characteristics of a conventional thin film transistor that is annealed at temperatures of 300 and 350° C. in which a GIZO channel layer in the thin film transistor is formed using an RF sputter method.
Figure 8:
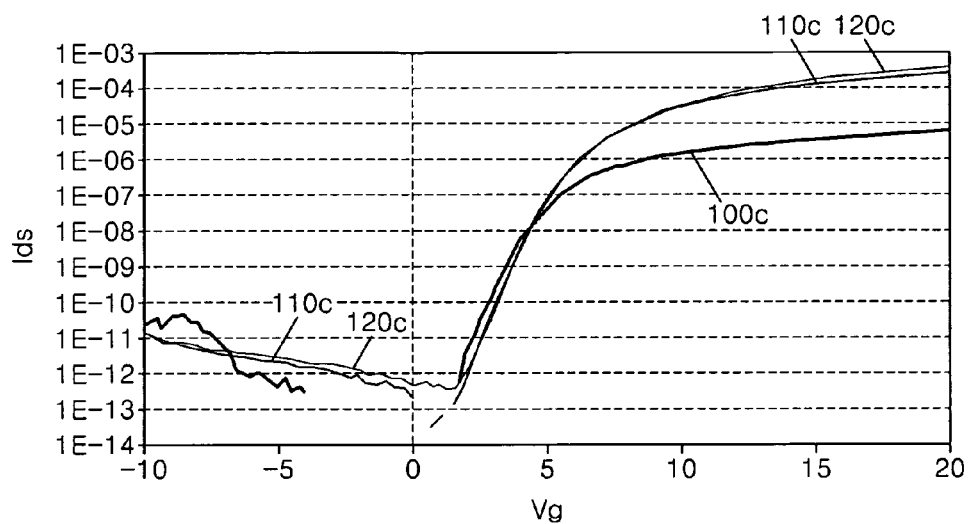
Figure 9:
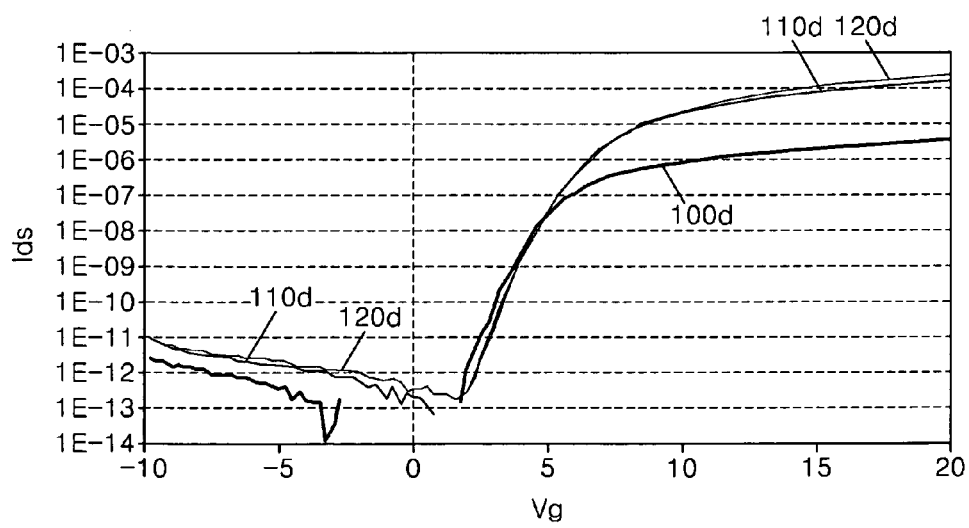

FIGS. 6 and 7 are graphs showing current-voltage characteristics of the first TFT according to at least one example embodiment and the conventional third TFT, both of which are annealed at a temperature of 300° C. FIGS. 8 and 9 are graphs showing the second TFT according to at least one example embodiment and the conventional fourth TFT, both of which are annealed at a temperature of 350° C.

In FIGS. 6 though 9, the first plots 100*a* though 100*d* represent current-voltage characteristics measured when the drain voltage Vd is fixed at 0.1V, the second plots 110*a* through 110*d* represent current-voltage characteristics measured when the drain voltage Vd is fixed at 5V, and the third plots 120*a* through 120*d* represent current-voltage characteristics measured when the drain voltage Vd is fixed at 10V.

When the graphs in FIGS. 6 and 7, which show the current-voltage characteristics of the first TFT according to at least one example embodiment and the conventional third TFT annealed at a temperature of 300° C., are compared, the current-voltage characteristics of the first TFT and the third TFT are not much different. Also, when the graphs in FIGS. 8 and 9, which show the current-voltage characteristics of the second TFT according to example embodiments and the conventional fourth TFT annealed at a temperature of 350° C., are compared, the current-voltage characteristics of the second TFT and the fourth TFT are not much different.

From the experiment results as shown in FIGS. 6 through 9, the current-voltage characteristics of the semiconductor device of example embodiments, in which the channel layer is formed in the DC sputter chamber that includes an oxide semiconductor target having a resistance of 1 kΩ or less, manufactured using the process of manufacturing a semiconductor device according to example embodiments, are not much different from the current-voltage characteristics of the semiconductor device whose channel layer is formed in a conventional RF sputter chamber.

From the result shown in FIG. 2 that shows the deposition rate of a GIZO layer (channel layer) in the DC sputter chamber using an oxide semiconductor target and the conventional RF sputter chamber, the time required for manufacturing the first and third TFTs according to example embodiments may be much shorter than the time required for manufacturing the conventional second and fourth TFTs.

As described above, in a method of manufacturing a semiconductor device according to example embodiments, a channel layer is an oxide semiconductor layer, and is formed in a chamber, for example, a DC sputter chamber having an oxide semiconductor target.

On the other hand, in the above described oxide semiconductor target and methods of forming the oxide semiconductor layer and the semiconductor device, the first through third oxides respectively may be $HfO_2$, $In_2O_3$, and ZnO, where $0<x<1$, $y\geqq 0.15$, and $z\geqq 0.15$. The first through third oxides respectively may also be $HfO_2$, $In_2O_3$, and ZnO, where x, y, and z meet one of the following three sets of conditions: $x+y=1$, $0.15\leqq x\leqq 0.85$, $z=0$; $y+z=1$, $0.15\leqq y\leqq 0.85$, $x=0$; and $0.15\leqq z$, $y=0$. A molar ratio of $HfO_2$:$In_2O_3$:ZnO may also be 0.1:1:2, 0.2:1:2, 0.3:1:2 or 0.4:1:2.

A method of manufacturing an oxide semiconductor target having a resistance of 1 kΩ or less according to at least one example embodiment will now be explained.

Figure 10:
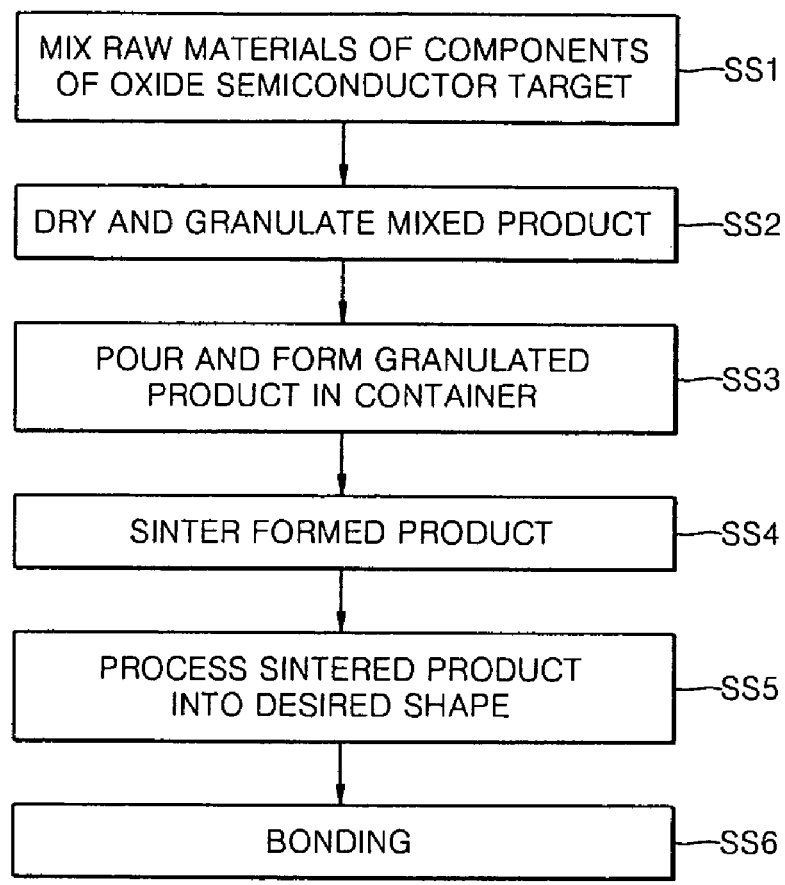
FIG. 10 is a block diagram illustrating a method of manufacturing an oxide semiconductor target having a resistance of 1 kΩ or less according to at least one example embodiment.

Referring to FIG. 10, in operation SS1, raw materials of components constituting the oxide semiconductor target may be mixed. When the oxide semiconductor target has a composition of x(first oxide).y(second oxide).z(third oxide) wherein x, y, and z are molar ratios as described above, the raw materials of the first through third oxides may be mixed at a given ratio. Each of the raw materials of the first through third oxides may be any one of $Ga_2O_3$, $HfO_2$, $In_2O_3$, ZnO, and SnO. The raw materials of the first through third oxides may be different from one another. When the raw materials of the first through third oxides are the same as described the above, the molar ratio at which the raw materials of the first through third oxides are mixed may be determined by relationships between x, y, and z described in the method of manufacturing the oxide semiconductor layer. The first oxide may be one of $Ga_2O_3$, $HfO_2$, $In_2O_3$, ZnO, and SnO, and $x=1$, y and $z=0$.

In the mixing of the raw materials, the raw materials may be small balls or beads. In this case, the mixed product obtained after the mixing of the raw materials may be grinded to powder.

In operation SS2, the mixed product is dried and granulated.

In operation SS3, the granulated product is poured and formed in a mold.

The granulated product may be formed into various shapes according to various purposes in operation SS3. For example, when the oxide semiconductor target is used for a sputter, the granulated product may be formed into a shape suitable for the sputter. The forming may be performed by various methods, for example, cold isostatic pressing.

In operation SS4, the formed product may be sintered. The sintering of the formed product may be performed in an apparatus such as a furnace for sintering at a given temperature in a given atmosphere, e.g., a vacuum atmosphere, an atmospheric pressure atmosphere, or a non-oxidizing atmosphere, according to the raw materials.

For example, the raw materials of the first through third oxides may be Ga2O3, In2O3, and ZnO, respectively. When a ratio at which these raw materials are mixed is 2:2:1 as a molar ratio, a sintering temperature in operation SS4 may range from approximately 1400 to 1500° C., and a sintering atmosphere in operation SS4 may be a nitrogen (N2) atmosphere. When the oxide semiconductor target does not include the first oxide, the raw materials of the second and third oxides may be respectively In2O3 and ZnO, and a ratio at which these raw materials are mixed may be 1:2 as a molar ratio, a sintering temperature in operation SS4 may range from approximately 1350 to 1500° C., and a sintering atmosphere in operation SS4 may be an air atmosphere. In operation SS4, a sintering temperature may range from approximately 1300 to 1600° C., and a sintering atmosphere may be an atmosphere including air, oxygen, nitrogen, or oxygen and nitrogen.

The raw materials of the first through third oxide may be HfO2, In2O3 and ZnO, respectively. In this case, a sintering temperature and a sintering atmosphere may be the same as described the above.

In operation SS5, the sintered product may be processed into a desired target shape. For example, in operation SS5, the sintered product may be processed so that the sintered product has smooth surface.

Through these operations, an oxide semiconductor target having a resistance of 1 kΩ or less may be formed.

In addition, after the processing the sintered product, in operation SS6, the oxide semiconductor target processed in operation SS5 may be bonded to a supporter. The supporter may be a metal pad. For example, the metal pad may be a cupper pad. Also, the oxide semiconductor target processed in operation SS5 and the supporter may be bonded to each other using an adhesive. For example, the adhesive may comprise Ag or Ni.

When the method of manufacturing a semiconductor device according to example embodiments is used, the current-voltage characteristics of a semiconductor device that includes the channel layer may be maintained equal to the current-voltage characteristics of a semiconductor device that includes a channel layer formed using a conventional RF sputtering method. However, productivity may be increased because the deposition rate of the channel layer in the method of manufacturing a semiconductor device according to example embodiments may be much higher than that of the conventional method.

It will be understood by those skilled in the art that various changes in form and details may be made therein without departing from the spirit and scope of example embodiments, for example, the technique for forming an oxide semiconductor layer using the DC sputter chamber that includes an oxide semiconductor target may be applied not only to manufacture TFTs but also other semiconductor devices that use an oxide semiconductor layer. Also, the method of forming an oxide semiconductor layer described above may be applied to manufacture a TFT having various structures. Therefore, the scope of example embodiments is defined not by the detailed description but by the appended claims.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An oxide semiconductor target having a resistance that is less than or equal to 1 kΩ, wherein the oxide semiconductor target has a composition of $x(HfO_2).y(In_2O_3).z(ZnO)$, wherein x, y, z are molar ratios, and wherein $0<x<1$, $y \geq 0.15$, and $z \geq 0.15$.

2. The target of claim 1, wherein a molar ratio of $HfO_2$: $In_2O_3$: ZnO is 0.1:1:2, 0.2:1:2, 0.3:1:2 or 0.4:1:2.

3. An oxide semiconductor target having a resistance that is less than or equal to 1 kΩ, wherein the oxide semiconductor target has a composition of $x(HfO_2).y(In_2O_3).z(ZnO)$, wherein x, y, z are molar ratios, and, wherein x, y, and z meet one of the following three sets of conditions:

$$x+y=1, 0.15 \leq x \leq 0.85, z=0;$$

$$y+z=1, 0.15 \leq y \leq 0.85, x=0; \text{ and}$$

$$x+z=1, 0.15 \leq z, y=0.$$

4. The oxide semiconductor of claim 3, wherein a molar ratio of $HfO_2$: $In_2O_3$: ZnO is 0.1:1:2, 0.2:1:2, 0.3:1:2 or 0.4:1:2.

* * * * *